United States Patent [19]

Hayashi et al.

[11] 3,821,776

[45] June 28, 1974

[54] DIFFUSION SELF ALIGNED MOSFET WITH PINCH-OFF ISOLATION

[75] Inventors: Yutaka Hayashi; Yasuo Tarui, both of Tokyo, Japan

[73] Assignee: Kogyo Gijutsuin, Tokyo, Japan

[22] Filed: Dec. 27, 1971

[21] Appl. No.: 211,915

[30] Foreign Application Priority Data

Dec. 28, 1970 Japan .......................... 45-120119

[52] U.S. Cl. ...................... 357/23, 357/41, 357/22

[51] Int. Cl. ........................ H01l 19/00, H01l 5/06

[58] Field of Search ..................... 317/235 G, 235 B

[56] References Cited

UNITED STATES PATENTS

| | | | |
|---|---|---|---|
| 3,035,186 | 5/1962 | Doucette | 317/235 G |
| 3,437,891 | 4/1969 | Yamashita | 317/235 B |
| 3,456,168 | 7/1969 | Tatom | 317/235 B |
| 3,514,845 | 6/1970 | Legat et al. | 317/235 G |
| 3,533,159 | 10/1970 | Hudson | 317/235 A |
| 3,614,555 | 10/1971 | Glinski | 317/235 E |
| 3,615,938 | 10/1971 | Tsai | 317/235 G |
| 3,639,813 | 2/1972 | Kamoshida et al. | 317/235 B |
| 3,641,405 | 2/1972 | Brown et al. | 317/235 B |
| 3,652,908 | 3/1972 | Lepselter et al. | 317/235 B |
| 3,667,115 | 6/1972 | Barson et al. | 317/235 B |
| 3,685,140 | 8/1972 | Engler | 317/235 B |

OTHER PUBLICATIONS

Tarui et al., Vortrag zum 4. Mikroelektronik-Kongress, Muenchen, Nov. 9–11, 1970, pp. 103–128 (R. Oldenbourg Verlag, Munich, Germany).

Boleky et al., "MOS memory travels in fast bipolar crowd," Electronics, July 20, 1970, pp. 82–85.

*Primary Examiner*—Rudolph V. Rolinec
*Assistant Examiner*—William D. Larkins
*Attorney, Agent, or Firm*—Robert E. Burns; Emmanuel J. Lobato; Bruce L. Adams

[57] ABSTRACT

An insulated gate field-effect transistor comprises a semiconductor substrate having a first and second region of opposite conductivity type from the substrate and having an impurity concentration greater than the substrate so as to develop depletion layers therebetween. A source region and a drain of the same conductivity type as the substrate are formed in the first region and the second region respectively. The depletion layers meet to electrically isolate a channel between the drain and source regions from the rest of the substrate. An insulating layer overlies the channel, a gate electrode is disposed on the insulating layer, and metallic source and drain electrodes make ohmic contact with the source and drain respectively. A plurality of insulated gate-field effect transistors are fabricated in an integrated circuit to form complementary pairs.

8 Claims, 15 Drawing Figures

DIFFUSION SELF ALIGNED MOSFET WITH PINCH-OFF ISOLATION

BACKGROUND OF INVENTION

This invention relates generally to the semiconductor art and more particularly to a new and improved high-performance insulated gate field-effect transistor structure adapted for integration on a semiconductor substrate.

Conventional insulated gate field-effect transistors (abbreviated simply IGFET hereinafter) have been accompanied by the following difficulties in fabricating integrated circuitry:

1. A load IGFET and IGFET as an amplifying element are formed in the same semiconductor substrate. For this reason, parameters such as the threshold voltage of the load IGFET vary with the output voltage of the circuit, resulting in deleterious effects, for example, a reduction in the output voltage or in the gain.

2. In integrating the complementary circuit on a single substrate according to the conventional IGFET structure, three diffusion processes were needed. When $SiO_2$ is used as a gate insulating film, for example, the source 31 and the drain 32 of an n-channel field-effect transistor as shown in FIG. 1 must be formed sufficiently inward in a $P^-$ island 2. The source 41 or the drain 42 of a P-channel field-effect transistor formed in the substrate 1 must be sufficiently removed from the $P^-$ island by taking the overlapping accuracy of photo etching and the extending range of the depletion layer into consideration. These requirements have made inevitably necessary a large area per function in the element fabrication. Reference numerals 34 and 35 respectively designate the gate-insulation film and the gate electrode of a transistor containing the source 31 and the drain 32. Reference numerals 44 and 45 respectively designate a gate-insulation film and a gate electrode of a transistor containing the source 41 and the drain 42.

3. When a p-type diffusion layer is used as the island 2, the impurity concentration of the island 2 becomes large and, hence, the capacitances of junctions such as the drain junction of the n-channel FET increase. This diminishes the mobility of electrons or carriers. Therefore, the high-speed properties of the n-channel FET are not exhibited.

SUMMARY OF THE INVENTION

It is an object of this invention to provide an extremely compact, high-response-speed IGFET structure requiring only few diffusion steps in fabrication and having a circuit performance which is least affected by a common substrate.

According to this invention there is provided an insulated gate field-effect transistor comprising a semiconductor substrate of one conductivity type and a channel of the same conductivity type, at least a part of the channel being electrically isolated from the substrate by a depletion layer formed by a junction between a region of a conductivity type differing from that of the substrate and the substrate.

According to another aspect of this invention, there is provided a plurality of insulated gate field-effect transistors as specified above which constitute at least one part of an integrated circuit.

The nature, principles, utility, and other features of this invention will be apparent from the following detailed description of the invention when read in conjunction with the accompanying drawings, in which like parts are designated by like reference numerals and characters.

BRIEF DESCRIPTION OF THE DRAWINGS

In the drawings:

FIG. 3(*b*) is a diagram showing an equivalent circuit of the transistor shown in FIG. 3(*a*);

FIG. 6(*b*) is a diagram showing an equivalent circuit of the transistor shown in FIG. 6(*a*);

DETAILED DESCRIPTION

Figure 1:
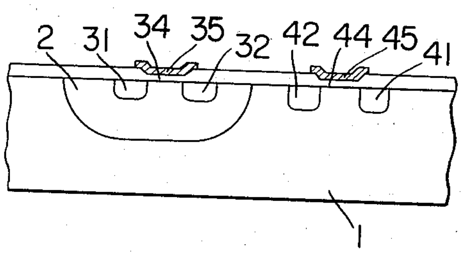
FIG. 1 is a schematic cross section of integrated circuitry for a conventional complementary insulated gate field-effect transistor pair.
Figure 2:
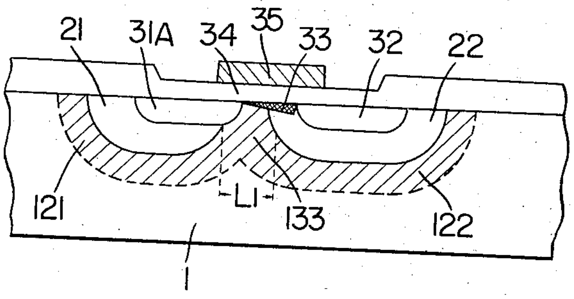
PRIOR ART FIG. 2
FIG. 2 is a schematic sectional view of an embodiment of this invention.

In order to overcome the above-described difficulties accompanying conventional field-effect transistors, this invention comtemplates the provision of an insulated gate field-effect transistor having a channel or a drain of the same conductivity type as the substrate, a part of which is electrically isolated therefrom by a depletion layer. FIG. 2 is a schematic sectional view of an example of the invention wherein a semiconductor substrate 1 has semiconductor regions 21 and 22 differing in conductivity type from the semiconductor substrate. Since the impurity concentration in these regions 21 and 22 is greater than that in the substrate, depletion layers 121 and 122 at the junction with the substrate are formed within the substrate.

Provided the spacing $L_1$ between regions 21 and 22 as measured along the semiconductor surface is sufficiently small so that the relationship $$L1 < 2\sqrt{\frac{2\epsilon se\, V_T}{q\, N_B}} \qquad (1)$$

is satisfied, the layers 121 and 122 expand in the region 133 existing between channel 33 and substrate with the result that channel 33 is isolated from the substrate.

It will be assumed that the impurity concentration $N_B$ in the substrate is $10^{14}$ atoms/cm$^3$, the dielectric constant $\epsilon_{se}$ of the semiconductor is $12 \times 8.85 \times 10^{-14}$ F/cm, and voltage $V_T$ is 0.8 volt. Then, the channel 33 and the substrate 1 are electrically isolated from each other for L*i* less than 6.5 microns. Even if L*i* is greater than the value defined by Equation (1), isolation is possible by applying a reverse bias across the source region 32 and the region 22. Furthermore, substrate 1 is reverse-biased in excess of $|V_R|$ with respect to region 22, where $|V_R|$ should be greater than $q\,{}^{N}B/8\,\epsilon se\,Li^2 - |V_T|$.

The above described IGFET structure comprising a drain 31A, a source 32, a gate insulated film 34, and a gate electrode 35 is isolated from the substrate 1 by regions 21, 22, and 133. Therefore, variations of transistor parameters due to the influence of substrate 1 are small irrespective of changes in the source voltage. Operation is possible irrespective of whether the region 21 is equipotential with region 22 or with drain region 31A.

In the latter case, in particular, the equivalent drain junction capacitance, or the junction capacitance between the region 21 and substrate 1, takes an extremely small value because the substrate 1 can be made of a high-resistivity semiconductive material. The region 31A may be in contact with the region 22, or regions 22 and 32 may be formed by the diffusion process using two separate diffusion steps.

The length of the channel portion along the channel of the region 22 may be formed with a tolerance of less than 1 micron by the double diffusion process for the formation of regions 22 and 32 through the same diffusion channel. That portion of the channel region 33 not in contact with the region 22 has a small impurity atom concentration. Therefore, if the drain voltage is close to the source voltage, the number of carriers in this portion becomes greater than that in the portion in contact with region 22, whereby the equivalent channel length becomes small. Thus, a transistor of small turn-on resistance and large $g_m$ can be produced.

Figure 3A:
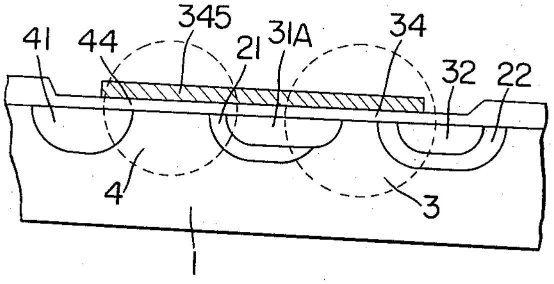
FIG. 3(*a*) is a schematic sectional view of an example of complementary integrated field-effect transistors using the structure shown in FIG. 2.
Figure 3B:
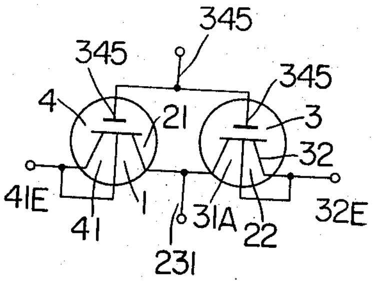

FIG. 3 is a schematic sectional view of an integrated complementary inverter structure using the IGFET structure shown in FIG. 2. The parts enclosed in circles 3 and 4 constitute, in combination, n- and p-channel IGFET's of complementary type. The transistor 3 has a channel of the same conductivity type as the substrate 1 and a structure as shown in FIG. 2. The same numerals are used for the same component parts in both FIGS. 2 and 3. The transistor 4 has a channel differing in conductivity type from the substrate 1, and region 41 has a conductivity type differing from that of the substrate. The drains of the transistor 4 is shared with the region 21 of the transistor.

For circuit operation, connections and biases are needed as follows. Terminals derived from the substrate 1 and region 41 through ohmic contacts are connected together to obtain a terminal 41E. 0 is applied to either power terminal 41E or 32E connected to the n-channel IGFET and a positive potential greater than the larger of the two threshold voltages, whichever is the larger, of the transistors is applied to the terminal conected to the p-channel IGFET. Then the integrated circuitry having the sectional structure shown in FIG. 3 operates as a complementary inverter. The same reference numerals are used for the corresponding parts throughout (*a*) and (*b*) in FIG. 3.

The threshold voltage of the transistor having the structure of FIG. 2, or the structure for part 3 in FIG. 3, is determined by the impurity concentration in that portion of region 22 which makes contact with the gate insulated film at the semiconductor surface (i.e., the chanel portion) and electrical performance represented by the flat band voltage of the insulated film 34. In other words, the threshold voltage can be designed by the impurity concentration in the channel portion of region 22. Region 21 on the drain region side 31A is not in contact with the semiconductor surface beneath the gate insulated film, and, hence, region 21 is unsymmetrical with respect to the source both in construction and in electrical performance.

Operation of the IGFET structure shown in FIG. 2 is possible even if the source-drain bias condition is reversed, except that the operation becomes unsymmetrical. Insulated gate field-effect transistors having symmetrical performance for reverse source-drain relationship play an important role in transistor gate applications. This can be realized by any of the examples shown in FIGS. 4 through 6.

Figure 4:
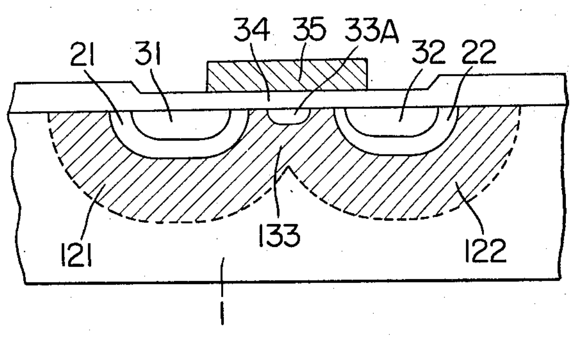
FIGS. 4 through 6(*a*) are schematic sectional views showing other embodiments of this invention.

In FIG. 4, a region 33A of the same conductivity type as the substrate 1 is formed in the vicinity of the semiconductor substrate 1 in which a depletion layer develops due to two regions 21 and 22 differing in conductivity from the substrate and between regions 31 and 32 to become a source and a drain of the same conductivity type as the substrate. Thus, the operation of the IGFET of channel type differing from the substrate is impeded, and the usable range of both drain and gate voltages is widened.

With complementary circuits both n- and p-channel type IGFET's operate are used. Accordingly, in the absence of 33A, when one IGFET of the same conductivity type as the substrate is turned off, the other IGFET of opposite channel type employing the regions 21 and 22 as source and drain is turned on. This becomes equivalently a source-drain leakage current.

Figure 6A:
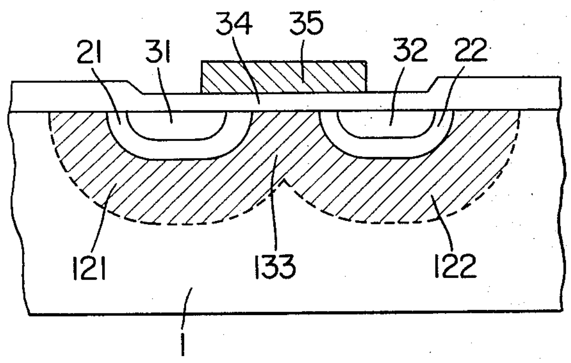
Figure 6B:
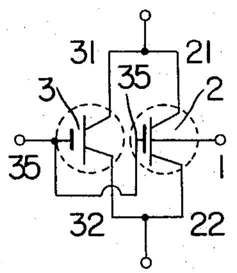
Figure 7A:
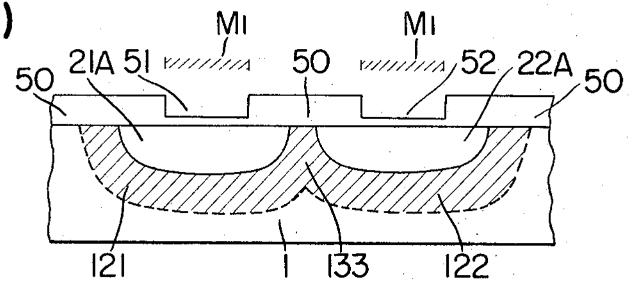
FIGS. 7(*a*) 7(*b*), 7(*c*), and 7(*d*) are sectional views illustrating a sequence of steps for fabricating the structure of the transistor shown in FIG. 2.
Figure 7B:
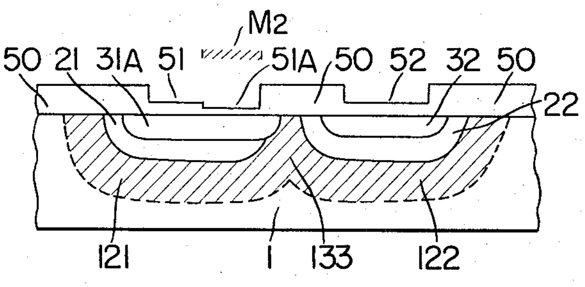
Figure 7C:
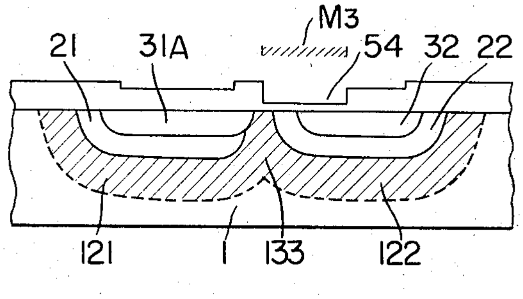
Figure 7D:
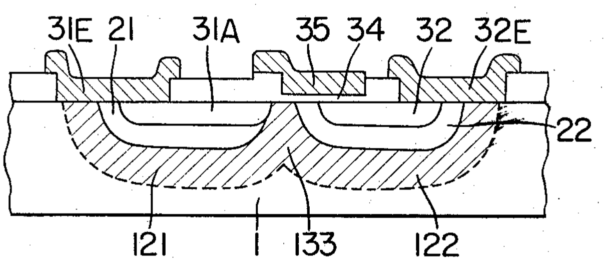

The present invention can be applied to non-complementary circuits, even if the circuit is destitute of region 33A as shown in FIG. 6. With this structure, a composite transistor device in which IGFET 3 of the same channel type as the substrate and IGFET 2 of opposite channel type are connected in parallel as indicated in FIG. 6(*b*) can be obtained. Regions 31 and 32 and regions 21 and 22 can be used as drain-source (or source-drain) pairs, but the drain voltage of transistor 3 (or 2) range from 0 volt to the opposite sign value of the threshold voltage of the other transistor connected in shunt with transistor 2 (or 3).

Figure 5:
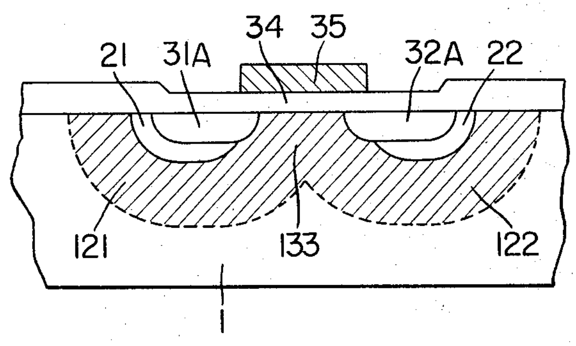

Another symmetrical type according to this invention is shown in FIG. 5. Regions 31A and 32A are used as source and drain (or vice versa) of the same conductivity type as substrate 1. Regions 21 and 22 differing in conductivity type from substrate are not in contact with the semiconductor surface beneath the gate-insulated film. In this case, the threshold voltage of the transistor is substantially governed by the electrical characteristics of the gate-insulated film.

A sequence of processes required for the fabrication of these embodiments will now be described. FIG. 7 illustrates sections for the fabrication processes for the example transistor shown in FIG. 2.

a. An insulation film 50 for diffusion masks is grown on a high-resistivity semiconductor substrate 1. Diffusion windows 51 and 52 are selectively formed by the known photoetching process using a photomask figure $M_1$. An impurity of conductivity type differing from that of the substrate is selectively diffused from diffusion windows 51 and 52 to form regions 21A and 22A. The regions 21A and 22A will be subsequently separated into regions 31A-21 and 32-22.

b. With the use of a photomask figure $M_2$, a diffusion channel 51A, a part of which overlaps diffusion channel 51 and shifted towards diffusion channel 52, is formed by applying the photoetching process to the oxide film and the insulation film 50 which were formed by the process (a). An impurity of the same conductivity type as the substrate is diffused from diffusion channels (51 + 51A) and 52 to form the regions 31A and 32. By suitably selecting the diffusion conditions for regions 21A and 22A, the oxide film formed on the surfaces of the diffusion channels after the process (a) can be made sufficiently thin so that the diffusion process (b) is not substantially impeded. Accordingly, the length of that part of the region (base) 22 in the channel direction that will make contact with the insulation film is determined by the same registration, or the difference between the diffusion lengths of two kinds of impurities diffused from the same diffusion channel 52. The length is a nominal dimension of the order of 1 micron.

c. Through the use of a photomask figure $M_3$, an insulation film of predetermined thickness is grown on that portion of the gate-insulated film which is formed thinner than the other after forming a channel in the insulation film which has been grown in the previous process. The necessary portion of the thinner insulation film is restricted only to that for use as the channel portion on the surface of the region 22. That portion of the insulation film beneath the gate electrode can be made thick to reduce the unnecessary capacitance.

d. Contact holes are formed so as to make a part of each of the surfaces 31A, 21, and 1 continuous, and, furthermore, a window is formed by the photoetching process so as to make a part of each of the surfaces 32, 22 and 1 continuous. Then a thin metallic film is deposited thereon by evaporation. This is followed by the formation of drain electrode 31E, gate electrode 35, and source electrode 32E by the photoetching process. For electrodes 31E and 32E, a suitable kind of metal and heat treatment should be selected so that each of the electrodes 31E and 32E can establish a Schottky barrier with the substrate 1.

Figure 8A:
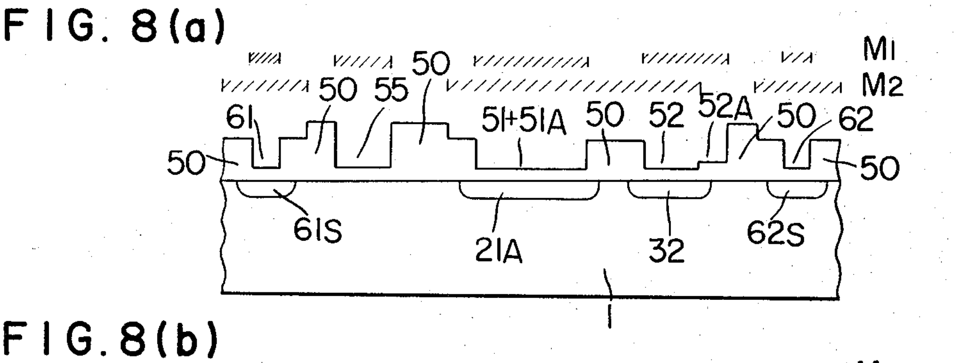
FIGS. 8(*a*), 8(*b*), and 8(*c*) are sectional views illustrating a sequence of steps for fabricating the structure of the transistor shown in of FIG. 3.
Figures 8B, 8C:
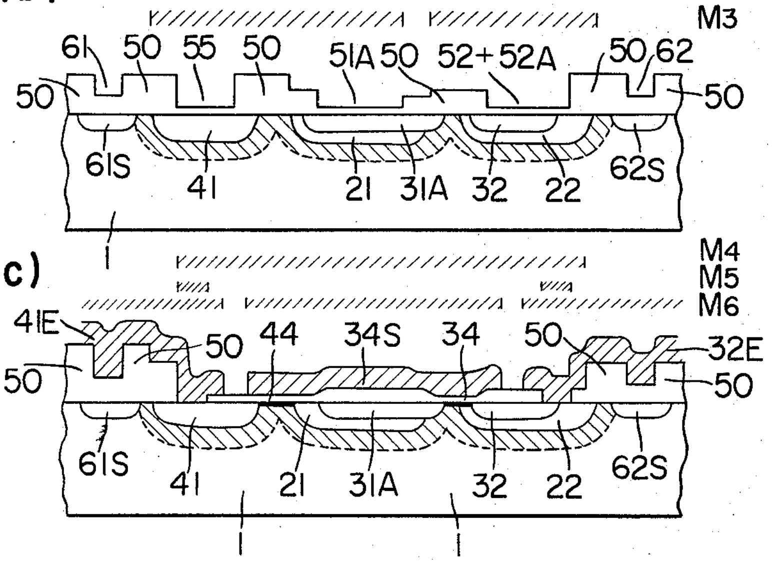

FIG. 8 illustrates a sequence of steps for the fabrication of the transistor shown in FIG. 3.

a. A thick insulation film for diffusion masks is grown on the substrate 1, and diffusion windows 61, 55, (51 + 51A), (52 + 52A), and 62 respectively for regions 61S, 41, 31A, 22, and 62S (as viewed from the left-hand side) are formed by the photoetching process by using a photomask $M_1$, whereby a thin insulation film of the order of thicknesses capable of masking impurities in regions such as 21A is regrown. Alternatively, the etching of the insulation film 50 is suspended before it is carried out to completion.) By this process, the registration of each region in the insulation film 50 is accomplished.

Then, in order to form regions 61S, 21A, 32, and 62S, all of the same conductivity type as the substrate and having higher impurity concentrations than in the substrate, a thin insulation film in the diffusion windows 61, (51 + 51A), 52, and 62 s selectively etched by using a mask $M_2$ having a figure such that it overlaps the above-mentioned windows but not with others. Then, an impurity having a smaller diffusion constant, e.g., antimony or arsenic, than an impurity (boron, if the substrate 1 is made of n-type silicon) for the formation of regions 41, 21, and 22 is diffused from the diffusion channels that have been previously provided to form regions 61S, 21A, 32, and 62S.

b. The thin insulation film in the diffusion windows 55, 51A, (52 + 52A) is etched by use of a photomask $M_3$ which is overlapped with 55, 51A, (52 + 52A) but not with others, and an impurity differing in conductivity type from the substrate 1 is diffused from these diffusion channels. By this process, the regions 41, 21, and 22 are formed.

c. That portion of the insulation film to become a gate insulated film and contact holes is photoetched by using a photomask $M_4$, and an insulation film of a necessary thickness for the gate-insulated film is grown.

This is followed, in succession, by the provision of contact holes by the use of a photomask $M_5$, the evaporation deposition of a thin metallic film, and the formation of the electrodes by the use of a photomask $M_6$.

The complementary integrated circuitry shown in FIG. 3 can be fabricated as described above. Incidentally, regions 61S and 62S are for the prevention of formation of parasitic IGFET's.

As described above, a highly packed, high-speed, and high performance integrated circuitry can be fabricated which requires only the same order of fabrication steps as the conventional.

Although a description of complementary integrated transistors circuit has been presented with respect to the above described embodiments of this invention, this invention can also find application in single-channel type integrated circuitry or single elements. In such a case, transistors insensitive to changes in the substrate, excellent DC characteristics, small parasitic capacitances, and small equivalent channel lengths can be employed.

We claim:

1. An insulated gate field-effect transistor comprising, a semiconductor substrate of a first conductivity type and having a major surface, a first and second region each of a second conductivity type formed in the major surface of said substrate, said first and second regions comprising a semiconductor having an impurity concentration greater than that of said substrate in order that each forms a depletion layer therewith, said first and second regions being spaced apart but disposed sufficiently close so that said depletion layers meet to electrically isolate a region between said first and second regions and adjacent the major surface of said substrate from the rest of said substrate, a drain region formed of a semiconductor of the first conductivity type disposed in said first region adjacent the major surface of said substrate, a source region formed of a semiconductor of the first conductivity type disposed in said second region adjacent the major surface of said substrate, an insulating layer disposed over a portion of a region of the major surface of said substrate comprising the region between said first and second regions and said second region, a gate electrode disposed on said insulating layer, and a source electrode and a drain electrode making ohmic contact with said source region and said drain region respectively.

2. In an insulated gate field-effect transistor according to claim 1 wherein at least one of said source electrode and said drain electrode is disposed over said source region and said drain region respectively.

3. A plurality of insulated gate field-effect transistors according to claim 2 which constitute at least one part of an integrated circuit.

4. A plurality of insulated gate field-effect transistors according to claim 1 which constitute at least one part of an integrated circuit.

5. In an insulated gate field-effect transistor according to claim 1 wherein at least one of said source region and said drain region is in electrical contact with said depletion layer.

6. In an insulated gate field-effect transistor according to claim 1 comprising, a third region of semiconductor formed in the major surface of said substrate between said first and second regions and having a conductivity type the same as said source and drain regions.

7. In an integrated circuit having a complementary pair of field effect transistors comprising, a first transistor according to claim 1, a second transistor having a source region in the major surface of said substrate disposed opposite said first region of said first transistor and having the same conductivity type, said first region serving as a drain region for said second transistor, a second insulating layer disposed on the major surface of said substrate over a region between said first region and said source region of said second transistor, a second gate electrode disposed on said second insulating layer and electrically connected to said first gate electrode, and a second source electrode connected to the source region of said second transistor.

8. In an integrated circuit according to claim 7 comprising, an insulating film overlying said substrate, and a common gate electrode for a complementary pair of insulated gate field-effect transistors disposed so as to overlay a channel of each of said transistors.

* * * * *